United States Patent
Dickinson et al.

(10) Patent No.: US 6,607,993 B1
(45) Date of Patent: Aug. 19, 2003

(54) METHOD USING ULTRAVIOLET RADIATION FOR INTEGRATED CIRCUIT MANUFACTURING

(75) Inventors: Ronald Dickinson, Singapore (SG); Yeow Meng Teo, Singapore (SG); Dong Xiang Qi, Singapore (SG); Rajan Rajgopal, Singapore (SG)

(73) Assignee: Chartered Semiconductor Manufacturing Ltd. (SG)

(*) Notice: Subject to any disclaimer, the term of this patent is extended or adjusted under 35 U.S.C. 154(b) by 0 days.

(21) Appl. No.: 10/224,061

(22) Filed: Aug. 19, 2002

(51) Int. Cl.$^7$ .................. H01L 21/4763; H01L 21/44; H01L 21/302; H01L 21/26
(52) U.S. Cl. .................. 438/795; 438/586; 438/597; 438/707; 438/710
(58) Field of Search .................. 438/149, 585–586, 438/589, 597, 607, 707–710, 795, 798

(56) References Cited

U.S. PATENT DOCUMENTS

| | | | | |
|---|---|---|---|---|
| 5,447,875 A | * | 9/1995 | Moslehi |
| 5,494,837 A | * | 2/1996 | Subramanian et al. |
| 5,956,597 A | * | 9/1999 | Furukawa et al. |
| 6,281,593 B1 | * | 8/2001 | Brown et al. |
| 6,440,756 B2 | * | 8/2002 | Shohet et al. |

* cited by examiner

Primary Examiner—Ha Tran Nguyen
(74) Attorney, Agent, or Firm—Mikio Ishimaru

(57) ABSTRACT

A method is provided for manufacturing an integrated circuit including a substrate with a gate layer and a gate dielectric provided on the substrate. The gate layer is formed into a gate using a process that imposes a charge in the gate dielectric. The substrate, gate, and gate dielectric are irradiated to discharge the charge across the gate dielectric.

18 Claims, 3 Drawing Sheets

METHOD USING ULTRAVIOLET RADIATION FOR INTEGRATED CIRCUIT MANUFACTURING

BACKGROUND

1. Technical Field

The present invention relates generally to manufacturing integrated circuits and more particularly to improving gate dielectrics in integrated circuits.

2. Background Art

Integrated circuits are now used in almost every type of product imaginable by the millions. They are used in everyday consumer products such as Game Boy® toys, wired and wireless telephones, home electrical appliances and computers, automobiles, etc. In industrial products, they are used in computer systems, control systems, etc.

Integrated circuits are generally formed in and on a semiconductor substrate of silicon. A gate dielectric is formed under a gate electrode and on the semiconductor substrate over a region within the substrate, which will serve as a channel region of an integrated circuit. The integrated circuits function when the channel region formed in the semiconductor substrate is biased to allow a current to flow from a source region to a drain region by way of the channel region. A gate voltage applied to the gate on top of the gate dielectric film provides the necessary bias. When the applied gate voltage exceeds the threshold voltage of the integrated circuit, current flows laterally from the source region to the drain region through the channel region, and the integrated circuit is turned "on".

The quality and integrity of the gate dielectric is critical to the functionality of the integrated circuit devices, which include a very tightly defined set of operational characteristics that, in turn, are very sensitive to the characteristics of the materials and process operations used to form the integrated circuit devices. It is important, therefore, to maintain the operational characteristics of a gate dielectric film, and specifically, to suppress any changes associated with the fixed electrical charge of a gate dielectric film and the interface region formed between the gate dielectric film and the underlying substrate surface.

A thermally grown oxide film, commonly used as a gate dielectric material in the semiconductor processing industry, carries with it an electrical charge, called a "fixed oxide charge". This fixed oxide charge influences the threshold voltage required for turning on a integrated circuit device. If the charge associated with the gate it is too high, due to trapped electrical charges, the characteristics of a film will be destroyed.

Defects, such as impurities and dangling or broken bonds, within the oxide film form "trap sites" or "traps". Traps within a gate oxide film can exist at the gate electrode/oxide interface, the bulk oxide film, or the oxide/substrate interface. Interface traps located at the oxide/substrate interface are especially prevalent. This is so because, during formation of the oxide film, a transition region forms between the crystalline silicon and the amorphous gate oxide. As a result the transition region includes many incompletely bonded species, which constitute trap sites. These trap sites are usually uncharged, but can become charged when electrons and holes are introduced into the oxide and become trapped at the trap site. One way the traps become charged is by avalanche injection of highly energetic electrons into the oxide. These highly energetic electrons are commonly called "hot carriers". Hot carriers are generally a result of plasma processes.

The gate dielectric is the heart of an integrated circuit and its integrity is a key reliability requirement for the integrated circuit. The gate dielectric must have high integrity, which means it must not have any pinholes or surface irregularities. Pinholes and surface irregularities will cause uncontrolled current flow in the semiconductor substrate and to the gate resulting in failure of the integrated circuit.

Gate dielectric integrity has become increasingly more important as the industry has pushed for greater miniaturization of the integrated circuits to produce smaller and more powerful products. This has required the gate dielectric to be thinner and thinner, which means that the pinholes and surface irregularities cause more and more problems.

In the past, gate dielectric improvement was achieved by methods, which were primarily preventative in nature; i.e., cleaner processes, less damaging processes, more conservative (and less competitive) designs, etc.

Solutions to these problems with the gate dielectric have long been sought, but have long eluded those skilled in the art.

DISCLOSURE OF THE INVENTION

The present invention provides a method for manufacturing an integrated circuit including a substrate with a gate layer and a gate dielectric provided on the substrate. The gate layer is formed into a gate using a process that imposes a charge in the gate dielectric. The substrate, gate, and gate dielectric are irradiated to discharge the charge across the gate dielectric. This method of manufacturing produces a thin gate dielectric with high integrity and without pinholes and/or surface irregularities, which would cause the gate dielectric to fail.

Certain embodiments of the invention have other advantages in addition to or in place of those mentioned above. The advantages will become-apparent to those skilled in the art from a reading of the following detailed description when taken with reference to the accompanying drawings.

DETAILED DESCRIPTION OF THE INVENTION

Figure 1:
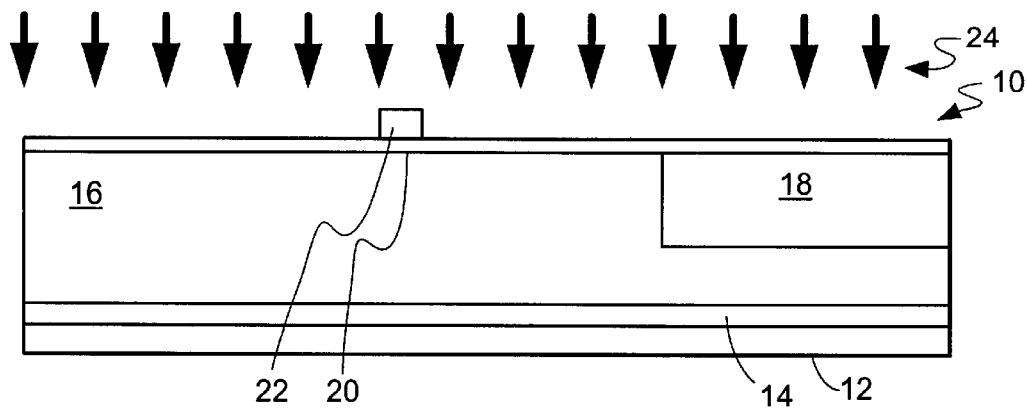
FIG. 1 is a view of an integrated circuit in an intermediate stage of manufacture in accordance with the present invention.

Referring now to FIG. 1, therein is shown an integrated circuit 10 in an intermediate stage of manufacture in accordance with the present invention. The integrated circuit 10 has a wafer substrate 12. Generally, an integrated circuit will be formed directly on the wafer substrate 12; however, in one embodiment, the wafer substrate 12 has an insulator 14 and a semiconductor substrate 16 formed thereon to form a silicon on insulator (SOI) integrated circuit.

The term "horizontal" as used in this application is defined as a plane parallel to the conventional plane or surface of a wafer or substrate, regardless of the orientation of the wafer or substrate. The term "vertical" refers to a direction perpendicular to the horizontal as just defined. Prepositions, such as "on", "side", "higher", "lower", "over", and "under" are defined with respect to the conventional plane or surface being on the top surface of the wafer or substrate, regardless of the orientation of the wafer or substrate. The term "process" as used herein is defined without being limiting to include one or more of the following: depositing or growing semiconductor materials, masking, patterning, photolithography, etching, implanting, removal, and/or stripping.

The semiconductor substrate 16 has a shallow trench isolation (STI) 18 formed therein to isolate semiconductor devices from one another. A gate dielectric 20 has been deposited/grown over the semiconductor substrate 16 and the STI 18. A layer of gate material, such as polysilicon or amorphous silicon, is deposited on the gate dielectric 20 and is formed into a gate 22 by an etching process 24, such as plasma etching.

A number of plasma etching steps and a number of plasma assisted film depositions may be used in forming the integrated circuit 10. Plasma processes involve introducing a reactive gas into a reaction chamber and then providing a high voltage across electrodes to cause a glow discharge of the reactive gas to generate a plasma of excited ions. By applying a voltage bias across the reaction chamber and the wafer, material can be either removed or added from a semiconductor structure.

During the electromagnetic excitation of the ions and the impacting of the ions on the material being etched or deposited, electrical charges deposit and accumulate on the surfaces of the material. Since these charges accumulate in the gate 22 and the semiconductor substrate is conductive, these charge deposits produce potential differences across the gate dielectric 20. Over time, these charge deposits are often sufficient to cause damage and/or breakdown of the gate dielectric 20. This damage and breakdown is referred to as "plasma induced damage" or PID. The PID cannot only reduce the performance of the integrated circuit 10, but can cause failure such that an entire product incorporating the integrated circuit 10 can be rendered useless.

Figure 2:
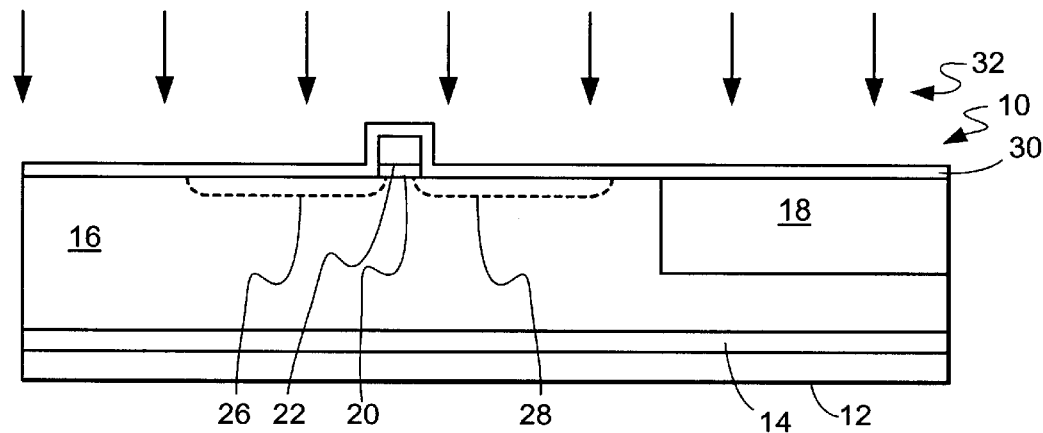
FIG. 2 is the structure of FIG. 1 after formation of the gate dielectric.

Referring now to FIG. 2, therein is shown the structure of FIG. 1 after formation of the gate dielectric 20. A source region 26 and a drain region 28 have been implanted in the semiconductor substrate 16 and a dielectric layer 30 has been deposited over the semiconductor substrate 16, the STI 18, the gate dielectric 20, and the gate 22. The dielectric layer 30 is transparent to ultraviolet radiation.

It has been discovered that, upon application of light energy or irradiation, such as by ultraviolet radiation 32 in the wavelength from about 150 nm to about 400 nm, photoinduced currents can be created to carry away the electric charges that can cause PID. The photon-induced currents in the dielectric layer 30 during this first application carry charges from the gate 22 through the dielectric layer 30 into the semiconductor substrate 16.

Figure 3:
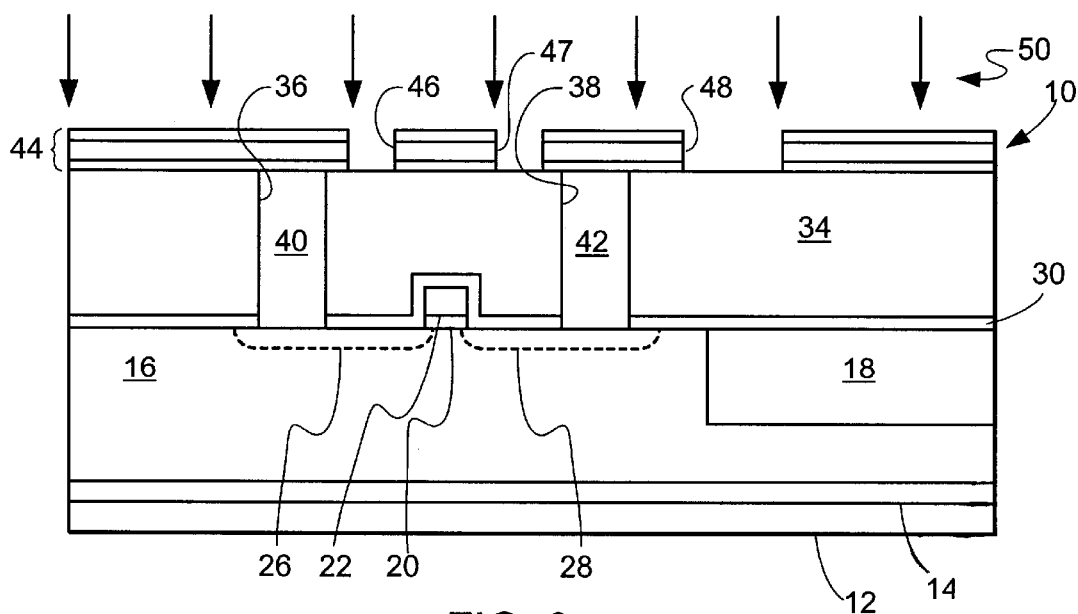
FIG. 3 is the structure of FIG. 2 after further processing.

Referring now to FIG. 3, therein is shown the structure of FIG. 2 after further processing. A first interlevel dielectric (ILD) layer 34 has been deposited over the dielectric layer 30 and source and drain contact openings 36 and 38 have been plasma etched through the first ILD layer 34 and the dielectric layer 30. The source and drain contact openings 36 and 38 are filled with a conductive material to form source and drain contacts 40 and 42 which are respectively in contact with the source and drain regions 26 and 28.

A first metal layer 44 has been deposited over the first ILD layer 34. The first metal layer 44 may include a bottom liner, a metal conductive layer, and a top liner or antireflective coating (ARC), each of which may comprise one or more layers of conductive thin film. The first metal layer 44 is processed and patterned to create openings 46, 47, and 48.

It has been further discovered that a ultraviolet irradiation 50 that is performed in the wavelength from about 150 nm to about 400 nm through the openings 46, 47, and 48 in the first metal-layer 44 will also discharge charges due to the plasmadeposition of the first ILD layer 34 and the plasma etching of the source and drain contact openings 36 and 38. During this second application, the charges are carried from the first ILD layer 34 to the source and drain contacts 40 and 42 and into the semiconductor substrate 16 to prevent PID to the gate dielectric 20.

Figure 4:
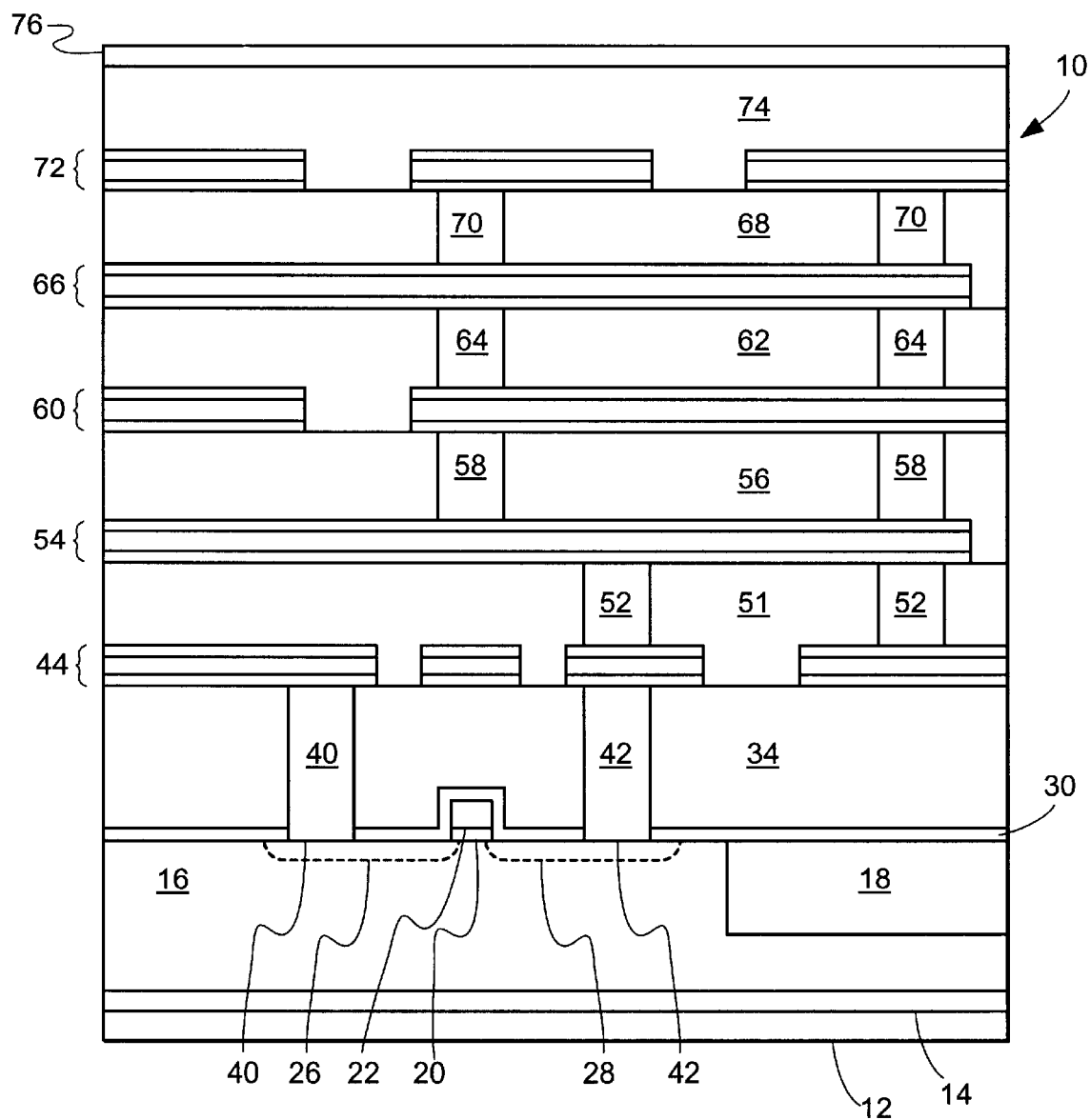
FIG. 4 is the structure of FIG. 3 as a completed integrated circuit in accordance with the present invention.

Referring now to FIG. 4, therein is shown the structure of FIG. 3 as a completed integrated circuit 10.

A second ILD layer 51 has been deposited, via openings have been plasma etched and filled to form vias 52, and a second metal layer 54 has been deposited and patterned.

A third application to ultraviolet radiation (not shown) has been performed to discharge charges across the gate dielectric 20.

A third ILD layer 56 has been deposited, via openings have been plasma etched and filled to form vias 58, and a third metal layer 60 has been deposited and patterned.

A fourth application to ultraviolet radiation (not shown) has been performed to discharge charges across the gate dielectric 20.

A fourth ILD layer 62 has been deposited, via openings have been plasma etched and filled to form vias 64, and a fourth metal layer 66 has been deposited and patterned.

A fifth application to ultraviolet radiation (not shown) has been performed to discharge charges across the gate dielectric 20.

A fifth ILD layer 68 has been deposited, via openings have been plasma etched and filled to form vias 70 and a fifth metal layer 72 has been deposited and patterned.

A sixth application to ultraviolet radiation (not shown) has been performed to discharge charges across the gate dielectric 20.

A sixth ILD layer 74 is deposited and capped by a capping layer 76.

It will be understood that optimal wavelengths, intensity, and application time will be determined heuristically based on the disclosure herein and the particular construction of the integrated circuit involved.

In one embodiment, the dielectric layer 30 and the dielectric layers in the first, second, third, fourth, and fifth metal layers 44, 54, 60, 66, and 72 are of silicon nitride. The first, second, third, fourth, fifth and sixth ILD layer's 34, 50, 56, 62, 68, and 74 are of silicon dioxide. The source and drain contacts 40 and 42, and vias 52, 58, 64, and 70, are of conductive materials such as tungsten, tantalum, or titanium, or of conductors such as aluminum or copper encased in a barrier material of tantalum or titanium or a nitride of titanium tantalum. The gate dielectric 20 is generally of silicon dioxide and the gate 22 is polysilicon or amorphous silicon. The wafer substrate 12 and the semiconductor substrate 16 are generally of (100) crystalline silicon. The insulator 14 is of silicon dioxide.

In one embodiment, the ultraviolet irradiation is performed at a wavelength from about 150 nm to about 400 nm at an intensity of about 120 mw/cm$^2$ to about 200 mw/cm$^2$ for an irradiation time of about 60 to 600 seconds.

Figure 5:
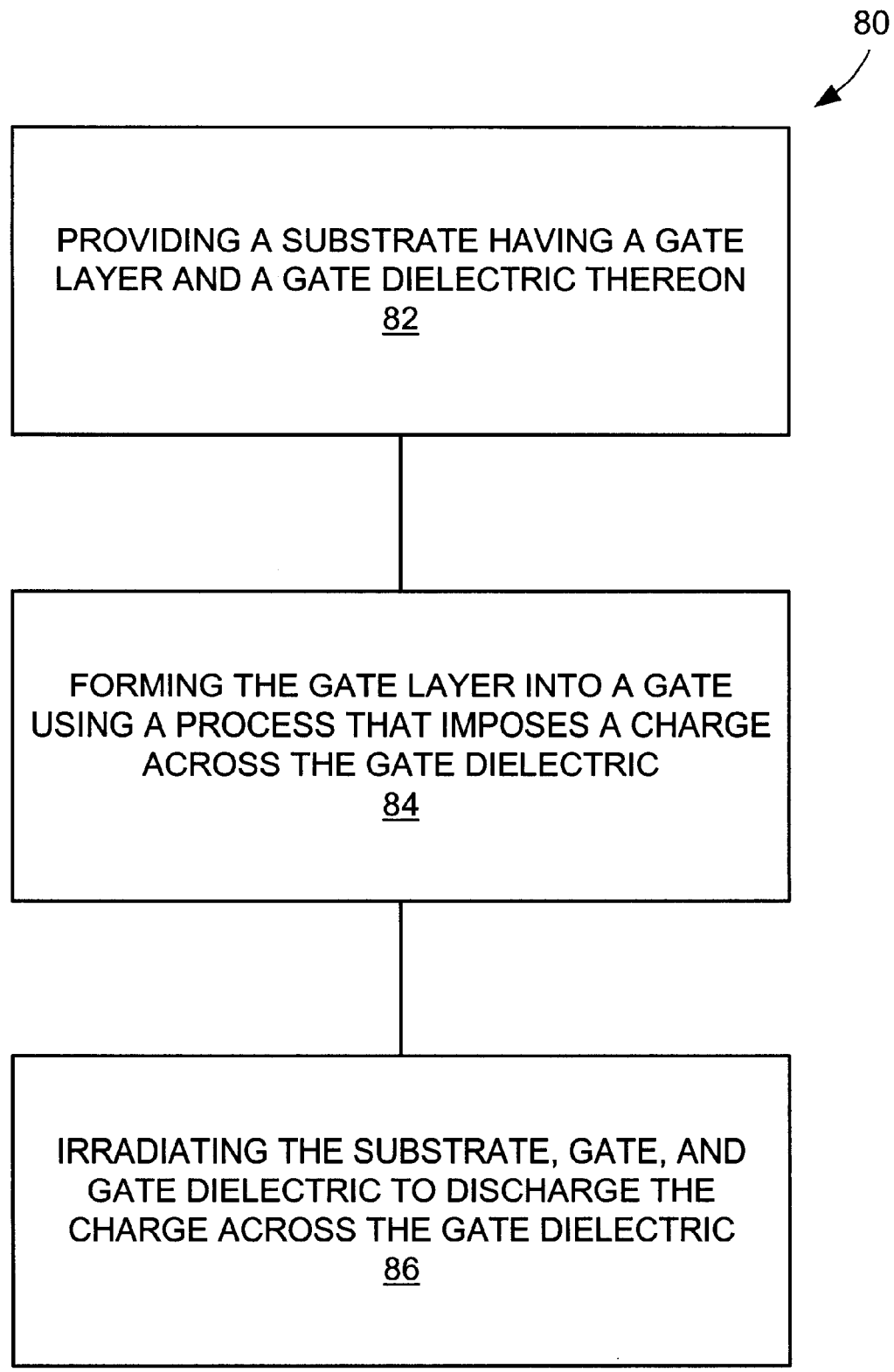
FIG. 5 is a simplified flow chart of the method in accordance with the present invention.

Referring now to FIG. 5, therein is shown a simplified flow chart 80 of the method in accordance with the present invention. A method includes: a step 82 for providing a substrate having a gate layer and a gate dielectric thereon; a step 84 for forming the gate layer into a gate using a process that imposes a charge across the gate dielectric; and a step 86 for irradiating the substrate, gate, and gate dielectric to discharge the charge across the gate dielectric.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hithertofore set forth herein or shown in the accompanying drawings are to be interpreted in an illustrative and non-limiting sense.

The invention claimed is:

1. A method for manufacturing an integrated circuit comprising:
    providing a substrate having a gate layer and a gate dielectric thereon;
    forming the gate layer into a gate using a process that imposes a charge across the gate dielectric; and
    irradiating the substrate, the gate, and the gate dielectric to discharge the charge across the gate dielectric by application of ultraviolet radiation from about 150 to about 400 nanometers at an intensity of about 120 mw/cm$^2$ to about 200 mw/cm$^2$.

2. The method as claimed in claim 1 wherein irradiation includes application of ultraviolet radiation for a period of about 60 to about 600 seconds.

3. The method as claimed in claim 1 additionally comprising:
    depositing an dielectric layer over the substrate; and
    wherein the irradiating is performed through the dielectric layer.

4. The method as claimed in claim 1 additionally comprising:
    depositing a dielectric layer over the substrate, the dielectric layer being transparent at a wavelength at which the dielectric layer is irradiated.

5. The method as claimed in claim 1 additionally comprising:
    depositing an dielectric layer over the substrate; and
    forming a contact in the dielectric layer by a process that imposes a charge across the gate dielectric, the contact in contact with the substrate.

6. The method as claimed in claim 1 additionally comprising:
    depositing an dielectric layer over the substrate;
    forming source and drain regions in the substrate; and
    forming first and second contacts in the dielectric layer by a process that imposes a charge across the gate dielectric, the first and second contacts respectively in contact with the source and drain regions.

7. The method as claimed in claim 1 additionally comprising:
    depositing a dielectric layer by a process leaving a charge in the gate dielectric;
    depositing a metal layer over the dielectric layer;
    patterning the metal layer; and
    irradiating the metal layer and the dielectric layer around the patterned metal layer to discharge the charge across the gate dielectric.

8. The method as claimed in claim 1 additionally comprising:
    depositing a dielectric layer by a process leaving a charge in the gate dielectric;
    forming a via in the dielectric layer by a process that imposes a charge across the gate dielectric;
    depositing a metal layer over the dielectric layer in contact with the via;
    patterning the metal layer; and
    irradiating the metal layer and the dielectric layer around the patterned metal layer to discharge the charge across the gate dielectric.

9. The method as claimed in claim 1 additionally comprising:
    providing a wafer substrate having an opening provided therein;
    providing an insulator over the wafer substrate; and
    wherein providing the substrate provides the substrate over the insulator to form a silicon on insulator structure.

10. A method for manufacturing an integrated circuit comprising:
    providing a semiconductor substrate having a silicon gate layer and a gate oxide thereon;
    forming the silicon gate layer into a silicon gate using a process that imposes a charge across the gate oxide; and
    irradiating the semiconductor substrate, the silicon gate, and the gate oxide to discharge the charge across the gate oxide using ultraviolet radiation by application of ultraviolet radiation from about 150 to about 400 nanometers at an intensity of about 120 mw/cm$^2$ to about 200 mw/cm$^2$.

11. The method as claimed in claim 10 wherein irradiation includes application of ultraviolet radiation for a period of about 60 to about 600 seconds.

12. The method as claimed in claim 10 additionally comprising:
    depositing an dielectric layer over the semiconductor substrate; and
    wherein the irradiating is performed through the dielectric layer.

13. The method as claimed in claim 10 additionally comprising: depositing a dielectric layer over the semiconductor substrate, the dielectric layer being transparent to ultraviolet radiation.

14. The method as claimed in claim 10 additionally comprising:
    depositing an dielectric layer over the semiconductor substrate, the dielectric layer transparent to ultraviolet radiation; and
    forming a contact in the dielectric layer by a process that imposes a charge across the gate oxide, the contact in contact with the semiconductor substrate.

15. The method as claimed in claim 10 additionally comprising:
    depositing an dielectric layer over the semiconductor substrate;
    implanting source and drain regions in the semiconductor substrate; and
    forming first and second contacts in the dielectric layer by a process that imposes a charge across the gate oxide, the first and second contacts respectively in contact with the source and drain regions.

16. The method as claimed in claim 10 additionally comprising:

depositing a dielectric layer by a process leaving a charge in the gate oxide;

depositing a metal layer over the dielectric layer;

patterning the metal layer; and irradiating the metal layer and the dielectric layer around the patterned metal layer to discharge the charge across the gate oxide using ultraviolet radiation.

17. The method as claimed in claim 10 additionally comprising:

depositing a dielectric layer by a process leaving a charge in the gate oxide;

forming a via in the dielectric layer by a process that imposes a charge across the gate oxide;

depositing a metal layer over the dielectric layer in contact with the via;

patterning the metal layer; and irradiating the metal layer and the dielectric layer around the patterned metal layer to discharge the charge across the gate oxide using ultraviolet radiation.

18. The method as claimed in claim 10 additionally comprising:

providing a wafer semiconductor substrate having an opening provided therein;

providing an insulator lining the opening; and wherein providing the semiconductor substrate provides the semiconductor substrate in the opening over the insulator to form a silicon on insulator structure.

\* \* \* \* \*